United States Patent [19]

Gilton

[11] Patent Number: 5,597,444
[45] Date of Patent: Jan. 28, 1997

[54] METHOD FOR ETCHING SEMICONDUCTOR WAFERS

[75] Inventor: Terry L. Gilton, Boise, Id.

[73] Assignee: Micron Technology, Inc., Boise, Id.

[21] Appl. No.: 593,226

[22] Filed: Jan. 29, 1996

[51] Int. Cl.$^6$ .............................................. H01L 21/3065
[52] U.S. Cl. ..................... 156/643.1; 156/646.1; 156/662.1; 216/64; 216/67
[58] Field of Search .............................. 156/643.1, 662.1

[56] References Cited

U.S. PATENT DOCUMENTS

| | | | |
|---|---|---|---|
| 4,162,185 | 7/1979 | Coburn et al. | 156/643 |
| 5,405,491 | 4/1995 | Shahvandi et al. | 156/643 |
| 5,409,563 | 4/1995 | Cathey | 156/643 |
| 5,419,804 | 5/1995 | Ojha et al. | 156/643 |
| 5,498,312 | 3/1996 | Laermer et al. | 156/643.1 |

*Primary Examiner*—R. Bruce Breneman
*Assistant Examiner*—Michael E. Adjodha
*Attorney, Agent, or Firm*—Margaret M. Dunbar

[57] ABSTRACT

Disclosed is a semiconductor etching method comprising exposing the wafer surface, in a plasma etching apparatus, to a radio-frequency plasma comprising a mixture of a noble gas and a saturated or unsaturated reduced carbon compound selected from the group consisting of acetylene ($C_2H_2$), benzene ($C_6H_6$), graphite or buckminsterfullerene ($C_{60}$) and a halogen compound selected from the group consisting of fluorine, chlorine, bromine, hydrogen chloride, hydrogen fluoride, hydrogen bromide, sulphur hexafluoride and nitrogen trifluoride.

14 Claims, 2 Drawing Sheets

METHOD FOR ETCHING SEMICONDUCTOR WAFERS

BACKGROUND OF THE INVENTION
1. Technical Field

This invention relates in general to a process for fabricating a semiconductor device, and more particularly to a plasma dry etching process. 1. Background The current practice in semiconductor manufacturing is to use thin film fabrication techniques. Etching, in semiconductor applications, is a fabrication process used to produce patterns by which material is removed from the silicon substrate or from thin films on the substrate surface. A mask is typically used to protect desired surface regions from the etchant and this mask is stripped after the etching has been performed. The composition and uniformity of these thin layers must be strictly controlled to facilitate etching of submicron features.

As the pattern dimensions approach the thicknesses of the films being patterned, it is increasingly required that a dry etching process be selected. The basic concept of plasma dry etching is rather direct. A plasma is defined to be a partially ionized gas composed of ions, electrons, and a variety of neutral species. A glow discharge is a plasma that exists over a pressure range of 1 mtorr to 5.6 torr, containing approximately equal concentrations of positive particles (positive ions) and negative particles (electrons and negative ions). In plasma etching applications the glow discharge can be used to produce energetic ionic bombardment of the etched surface. However, the glow discharge has another even more important role, that of producing reactive species, such as atoms, radicals and ions from a relatively inert molecular gas, for chemically etching the surfaces of interest. The gases adopted for plasma etching processes have traditionally been selected on the basis of their ability to form reactive species in plasma, which then react with the surface materials being etched and lead to volatile products. Conventional dry etching processes require the use of hazardous, carcinogenic and/or toxic gases.

Plasmas consisting of fluorine-containing gases, such as carbon tetrafluoride ($CF_4$), are extensively used for etching Si, $SiO_2$ and other materials in semiconductor fabrication. When a glow-discharge exists, some fraction of the $CF_4$ molecules are dissociated into other species. In addition to $CF_4$ molecules, ionic species, and electrons, there are a large number of radicals that are formed. A radical is an atom, or collection of atoms, which is electrically neutral, but which also exists in a state of incomplete chemical bonding, making it very reactive.

The radicals, in fact, are responsible for most of the actual chemical etching phenomena that occur at the surface of the material being etched (except for the etching of Al, which is apparently etched by molecular $Cl_2$).

In addition to $CF_4$ many different gases are used in dry etching processes for semiconductor fabrication, either individually or as the components of the mixtures of several gases. Chlorine plasmas etch polysilicon very anisotropically and exhibit excellent selectivity over $SiO_2$ but they etch Si more slowly than flourine containing gases.

Controlled anisotropic etching of Si with flourine-based plasmas is difficult and these plasmas exhibit undesirable characteristics in etching processes. Additionally, etch profiles vary widely with the processes parameters, especially the gas composition. Thus etch gases containing both chlorine and fluorine have come to be preferred for polysilicon etching. These etch gases are most often introduced as chloroflourocarbon (CFC) molecules such as freon™.

Molecules like carbon tetrachloride ($CCl_4$) and carbon tetraflouride ($CF_4$) are used because in a plasma reaction they produce the desirable reactive species which, in various combinations with other gases, etch silicon, silicon oxides, and other materials used in the manufacture of integrated circuits. Heavy hydrogenated analogs of these molecules like methyl chloride ($CH_3Cl$) or methyl flouride ($CH_3F$) tend to form polymers which interfere with the desired etch reaction. With the increased awareness of the effects CFC's have on the environment and concommitant health and safety restrictions and regulations, it is clear that semiconductor manufacturers can no longer rely on chloroflourocarbon molecules to provide the reactive species in plasma etching.

What is still needed is a dry plasma etch process that utilizes non-CFC compounds to provide the necessary reactive species for the semiconductor fabrication etch process.

SUMMARY OF THE INVENTION

It is an object of the present invention to provide a dry plasma etch process that utilizes non-CFC compounds to provide the necessary reactive species for the semiconductor fabrication etch process.

It is another object to provide a dry plasma etch process with an improved toxicological and environmental profile.

The present invention is a dry plasma etch process that utilizes non-CFC compounds to provide the necessary reactive species for the semiconductor fabrication etch process. More specifically, the process includes exposing a semiconductor wafer to a radio-frequency plasma in the known manner, the plasma comprising a mixture of a noble gas, a saturated or unsaturated, reduced carbon compound, and a halogen compound selected from the group consisting of fluorine, chlorine, bromine, hydrogen chloride, hydrogen fluoride, hydrogen bromide, sulphur hexafluoride and nitrogen trifluoride.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE PREFERRED EMBODIMENT

The semiconductor wafer etching method of the present invention is characterized by a dry plasma etch process that utilizes non-CFC compounds to provide the necessary reactive species for the semiconductor fabrication etch process.

Figure 1:
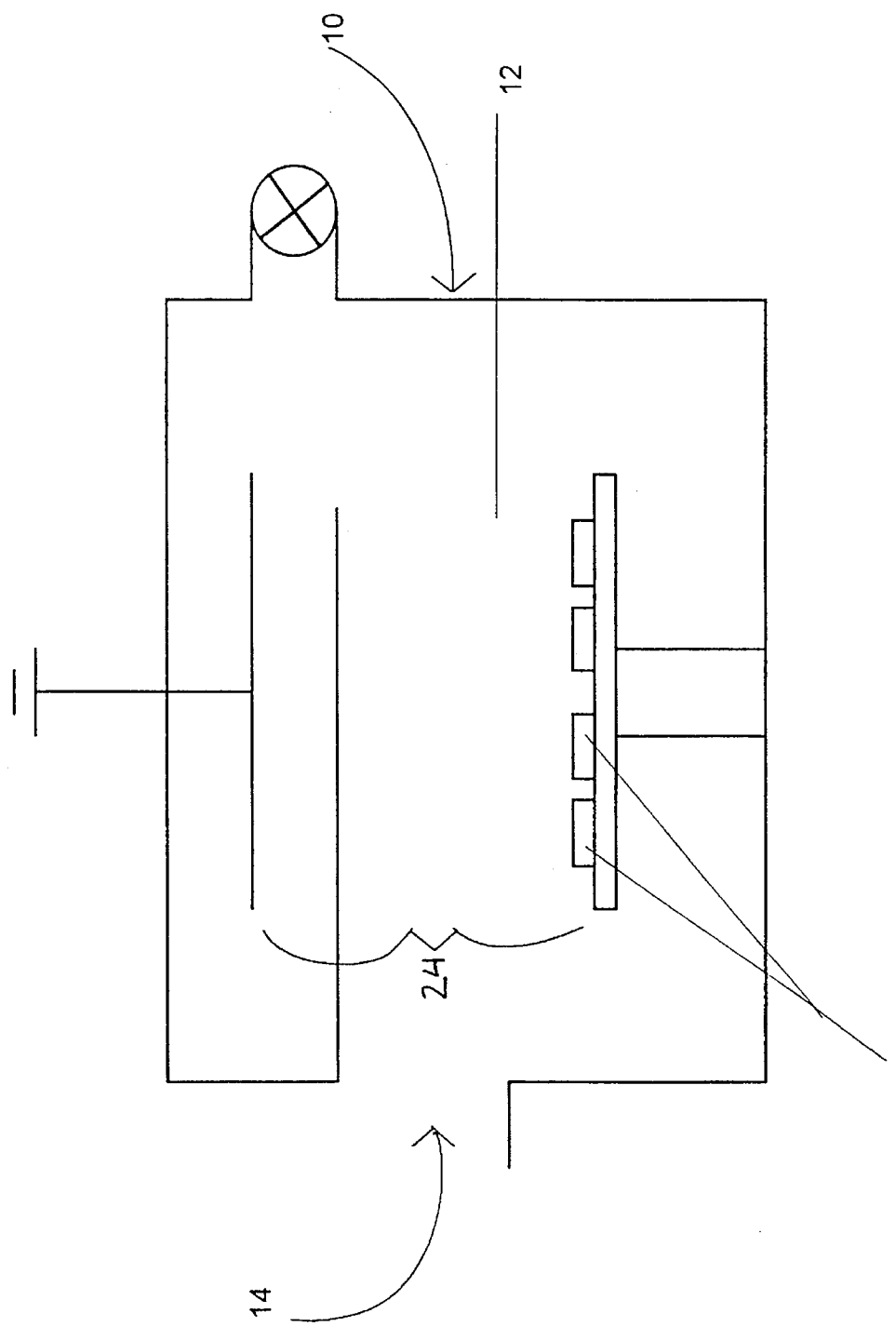
FIG. 1 is a schematic view of a first plasma dry etch system suitable for etching a substrate in accordance with the method of the invention.

This process can be performed in any conventional plasma etching system. One such plasma etching system is shown schematically in FIG. 1 and is generally designated as 10. The plasma etching system 10 includes a process chamber 12 in flow communication with a source or feed means 14 for introducing the non-CFC compounds to provide the necessary reactive species of the present invention.

Inside process chamber 12 is an rf pallet 16 which supports a plurality of semiconductor wafers 18 to be etched. The rf pallet 16 is connected to an rf source. A ground electrode 22 mounted within process chamber 12 opposite rf pallet 16 is connected to ground. With this arrangement the feed gas 14 is excited by the rf energy to form a plasma 24.

With plasma etching system 10, the wafers are located in generated plasma 24, which is directed at the wafer surface. Plasma 24 contains the reactive species (i.e. gas etchants) that react with wafer 18 in the semiconductor fabrication etch process. The chemistry of feed gas 14 is the object of this invention and will be described in greater detail below; it can be selected such that the wafer substrate is etched but the etching mask is not adversely affected. In general, the etch rate of such a system is a function of the rf power supplied to the electrodes, the chemistry of feed gas 14, and the vacuum level in process chamber 12. The etch rate may also be affected by a magnetic field which may be applied to the plasma by techniques that are well known in the art.

In a conventional plasma etching system the feed gas selected would be a CFC, such as freon$^{TM}$. It has become increasingly difficult to use CFC's in the face of ever stricter environmental health and safety regulations and restrictions which have been imposed on the use and disposal of CFC's.

The chemistry of the feed gas in the present invention is selected so as to provide a solution to the above problem. In the process of the present invention the carbon source is introduced in a non-CFC and more reduced form (CFC's are very oxidized) than even

DETAILED DESCRIPTION OF THE PREFERRED EMBODIMENT

The semiconductor wafer etching method of the present invention is characterized by a dry plasma etch process that utilizes non-CFC compounds to provide the necessary reactive species for the semiconductor fabrication etch process.

This process can be performed in any conventional plasma etching system. One such plasma etching system is shown schematically in FIG. 1 and is generally designated as 10. The plasma etching system 10 includes a process chamber 12 in flow communication with a source or feed means 14 for introducing the non-CFC compounds to provide the necessary reactive species of the present invention.

Inside process chamber 12 is an rf pallet 16 which supports a plurality of semiconductor wafers 18 to be etched. The rf pallet 16 is connected to an rf source. A ground electrode 22 mounted within process chamber 12 opposite rf pallet 16 is connected to ground. With this arrangement the feed gas 14 is excited by the rf energy to form a plasma 24.

With plasma etching system 10, the wafers are located in generated plasma 24, which is directed at the wafer surface. Plasma 24 contains the reactive species (i.e. gas etchants) that react with wafer 18 in the semiconductor fabrication etch process. The chemistry of feed gas 14 is the object of this invention and will be described in greater detail below; it can be selected such that the wafer substrate is etched but the etching mask is not adversely affected. In general, the etch rate of such a system is a function of the rf power supplied to the electrodes, the chemistry of feed gas 14, and the vacuum level in process chamber 12. The etch rate may also be affected by a magnetic field which may be applied to the plasma by techniques that are well known in the art.

In a conventional plasma etching system the feed gas selected would be a CFC, such as freon$^{TM}$. It has become increasingly difficult to use CFC's in the face of ever stricter environmental health and safety regulations and restrictions which have been imposed on the use and disposal of CFC's.

The chemistry of the feed gas in the present invention is selected so as to provide a solution to the above problem. In the process of the present invention the carbon source is introduced in a non-CFC and more reduced form (CFC's are very oxidized) than even the hydrogenated species, and these compounds are reacted in the plasma with elemental halogen, such as $Cl_2$ or $F_2$.

Figure 2:
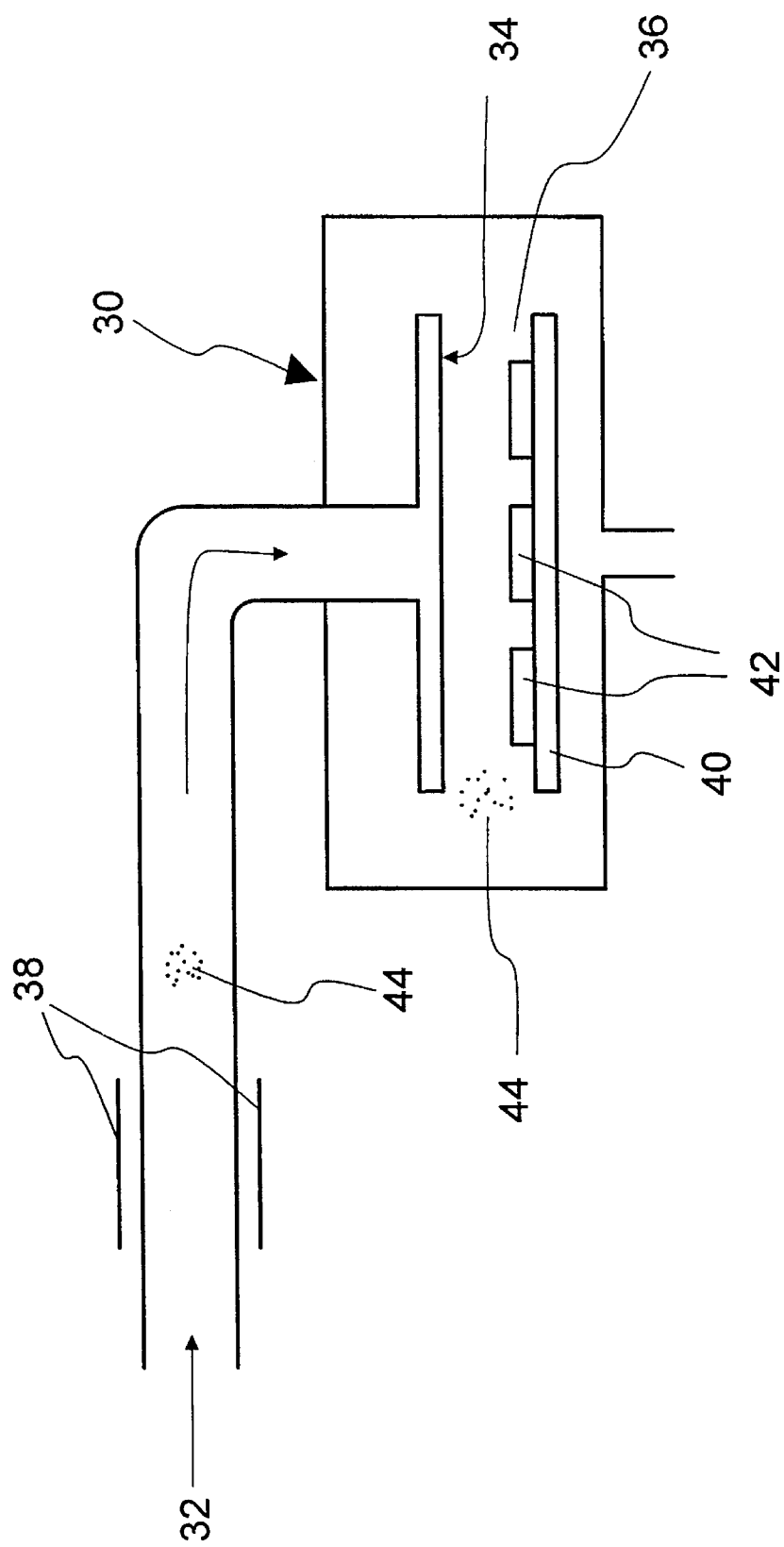
FIG. 2 is a schematic view of a second plasma dry etch system, allowing for in-situ fomation of reactive chemical species, suitable for etching a substrate in accordance with the method of the invention.

A second plasma etching system that can be used with this process is shown schematically in FIG. 2 and is generally designated as 30. With this type of etcher it is possible to use pure carbon either in the form of graphite or buckminsterfullerene ($C_{60}$) as the non-CFC carbon source. This is possible if one vaporizes the graphite or buckdminsterfullerene in-situ and reacts it down stream with the halogen gas. The buckminsterfullerene molecule is stable yet reactive enough to decompose in a plasma and react with the halogen.

A plasma etching system such as the one shown schematically in FIG. 2, is often referred to commercially as a downstream etch system. With such a plasma etching system 30, the reactive species are created in a plasma and then transported downstream to etch the wafers. The downstream etching system 30 includes a reaction plasma chamber 32 in flow communication by way of nozzle 34 with an etching chamber 36. Plasma chamber 32 has an external energy source to create the chemical species necessary for this configuration, here a pair of oppositely placed electrodes 38. Microwave sources can also be used with this configuration to create the reactive species.

Inside etching chamber 36 is pallet 40 which supports a plurality of semiconductor wafers 42 to be etched. In order to obtain directional etching, a bias must be applied in the known manner to wafer 42 in etching chamber 36.

With this arrangement plasma 44 is created in plasma chamber 32 by energy supplied by electrodes 38. The plasma 44 contains the reactant gases (i.e. gas etchants) that react with the wafer 42.

The process of this invention allows an etch reaction that does not use CFC's and yet emulates their chemistry. If hydrogen was needed in a particular process, then a hydrogen-halogen gas (like HCl), or selected hydrogenated molecule like benzene could be added.

In accordance with any embodiment of the present invention the chemical sources for the carbon and halogens used to provide the reactive species originate from non-CFC species. The carbon is provided in the form of a saturated or unsaturarted reduced carbon compound. The groups of unsaturated carbon compounds that can be used include graphite, the alkenes, alkynes. Additionally, aromatic and fullerene compounds can also be used. The alkenes are unsaturated hydrocarbons that contain one or more double carbon-carbon bonds in their molecules, an example being ethylene. The alkynes are unsaturated hydrocarbons that contain one or more triple carbon-carbon bonds in their molecules, an example being acetylene. The aromatic compounds are unsaturated compounds that contain a benzene ring. The fullerenes are compounds containing a fullerene ($C_{60}$) atom.

Turning now to the halogen sources for the method of this invention, the halogen component necessary for dry plasma etching can be provided in the form of fluorine gas, chlorine gas, bromine gas, hydrogen chloride, hydrogen fluoride, hydrogen bromide, sulphur hexafluoride, nitrogen trifluoride and or any non-CFC source.

By supplying the carbon in one of the unsaturated or reduced sources set forth above in combination with a non-CFC halogen source, the necessary reactive species for dry plasma etching can be generated without the use of CFC's which are damaging to the environment and are likely to be unavailable and impermissible by future environmental regulation. The plasma etch method of the present invention has the additional advantage of being less toxic than CFC's or HCFC's.

It will therefore be understood that modifications and variations are possible without departing from the scope of the invention as expressed in the following claims.

I claim:

1. A method for plasma etching semiconductor wafers in a plasma etching apparatus comprising:

exposing the wafer to a plasma comprising at least a mixture of a reduced carbon compound and a non-CFC halogen compound.

2. The method of claim 1 wherein the reduced carbon compound is selected from the group consisting of alkenes, alkynes, fullerenes and aromatic compounds.

3. The method of claim 1 wherein the reduced carbon compound is derived from graphite.

4. The method of claim 1 wherein the non-CFC halogen compound is selected from the group consisting of fluorine, chlorine, bromine, hydrogen chloride, hydrogen fluoride, hydrogen bromide, sulphur hexafluoride, and nitrogen trifluoride.

5. The method of claim 1 further comprising a pressure range of 1 to 200 mtorr for the plasma.

6. The method of claim 2 wherein the reduced carbon compound is derived from graphite.

7. The method of claim 2 wherein the non-CFC halogen compound is selected from the group consisting of fluorine, chlorine, bromine, hydrogen chloride, hydrogen fluoride, hydrogen bromide, sulphur hexafluoride, and nitrogen trifluoride.

8. The method of claim 2 further comprising a pressure range of 1 to 200 mtorr for the plasma.

9. The method of claim 6 wherein the halogen compound is selected from the group consisting of fluorine, chlorine, bromine, hydrogen chloride, hydrogen fluoride, hydrogen bromide, sulphur hexafluoride, and nitrogen trifluoride.

10. The method of claim 6 further comprising a pressure range of 1 to 200 mtorr for the plasma.

11. The method of claim 7 further comprising a pressure range of 1 to 200 mtorr for the plasma.

12. The method of claim 9 further comprising a pressure range of 1 to 200 mtorr for the plasma.

13. A method for plasma etching semiconductor wafers in a plasma etching apparatus comprising:

exposing the wafer to a plasma comprising a mixture of a noble gas;

a reduced carbon compound selected from the group consisting of acetylene ($C_2H_2$), benzene ($C_6H_6$), graphite and buckminsterfullerene ($C_{60}$); and a halogen compound selected from the group consisting of fluorine, chlorine, bromine, hydrogen chloride, hydrogen fluoride, sulphur hexafluoride, and nitrogen trifluoride.

14. The method of claim 13 further comprising a pressure range of 1 to 200 mtorr for the plasma.

* * * * *